United States Patent
Kawanishi et al.

(10) Patent No.: US 6,813,299 B2
(45) Date of Patent: Nov. 2, 2004

(54) SEMICONDUCTOR LASER DEVICE AND OPTICAL DISK REPRODUCING AND RECORDING APPARATUS

(75) Inventors: Hidenori Kawanishi, Nara (JP); Yoshie Fujishiro, Tenri (JP); Shuichi Hirukawa, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 10/341,246

(22) Filed: Jan. 14, 2003

(65) Prior Publication Data

US 2003/0138001 A1 Jul. 24, 2003

(30) Foreign Application Priority Data

Jan. 15, 2002 (JP) .......................... 2002-006271
Oct. 30, 2002 (JP) .......................... 2002-316075

(51) Int. Cl.⁷ .............................................. H01S 5/00
(52) U.S. Cl. ................................. 372/45; 372/46
(58) Field of Search ............................... 372/43–50

(56) References Cited

U.S. PATENT DOCUMENTS 5,172,384 A * 12/1992 Goronkin et al. ........... 372/45
5,633,886 A * 5/1997 Ramdani et al. ............ 372/45
6,127,691 A   10/2000 Fukunaga et al. ........... 257/17

FOREIGN PATENT DOCUMENTS

| JP | 10-4237 A | 1/1998 | ............ H01S/3/18 |
| JP | 11-220224 A | 8/1999 | ............ H01S/3/19 |

\* cited by examiner

Primary Examiner—Quyen Leung
(74) Attorney, Agent, or Firm—Nixon & Vanderhye P.C.

(57) ABSTRACT

There is provided a semiconductor laser device, which has an oscillation wavelength that is greater than 760 nm and smaller than 800 nm, high reliability, long operating life and a high output, and an optical disk reproducing and recording apparatus that employs the semiconductor laser device. At least first and second lower clad layers 103 and 133, a quantum well active layer 105 constructed of well layers and barrier layers, first and second upper clad layers 107 and 109 are laminated on a GaAs substrate 101. The well layer is made of InGaAsP. The well layer has a great layer thickness d of 160 Å, and assuming that an optical confinement coefficient in one layer of the well layer is $\Gamma$, then $\Gamma/d$ is set at a great value of $2.2 \times 10^{-4}$ Å$^{-1}$.

25 Claims, 10 Drawing Sheets

SEMICONDUCTOR LASER DEVICE AND OPTICAL DISK REPRODUCING AND RECORDING APPARATUS

BACKGROUND OF THE INVENTION

The present invention relates to semiconductor laser devices, and in particular, to a semiconductor laser device capable of achieving especially high power, high reliability, and long operating life and an optical disk reproducing and recording apparatus that employs the device.

Semiconductor laser devices are used for optical communication apparatuses, optical recording apparatuses and so on. In recent years, there have been increasing needs for making the devices have high operating speed and large capacities, and there is promoted research and development for improving various characteristics of the semiconductor laser devices to respond to the needs.

Among them, a 780-nm band semiconductor laser device to be used for an optical disk reproducing (recording) apparatus of CD, CD-R/RW and the like has conventionally been made of an AlGaAs-based material. There have also been growing demands for high-speed write on CD-R/RW, and the semiconductor laser device has been required to yield a high output in order to cope with the demands.

Figure 11:
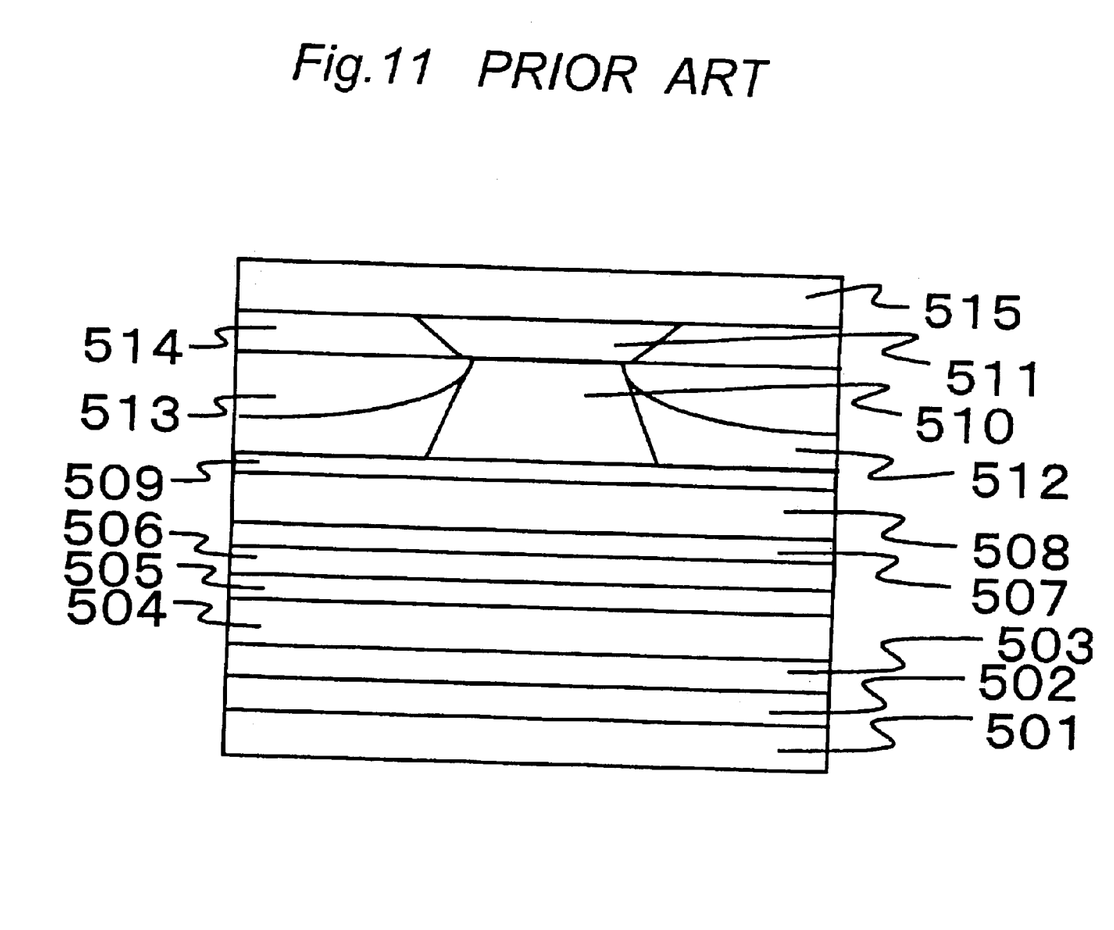
FIG. 11 is a sectional view in which a prior art semiconductor laser device is cut in a plane perpendicular to the stripe direction.

FIG. 11 shows a schematic view of a conventional AlGaAs-based semiconductor laser device. In this semiconductor laser device, an n-GaAs buffer layer 502, an n-$Al_{0.458}Ga_{0.542}As$ first lower clad layer 503, an n-$Al_{0.5}Ga_{0.5}As$ second lower clad layer 504, an $Al_{0.328}Ga_{0.672}As$ lower guide layer 505, a multiple quantum well active layer 506 where $Al_{0.115}Ga_{0.885}As$ well layers (layer thickness: 74 Å, two layers) and an $Al_{0.346}Ga_{0.654}As$ barrier layer (layer thickness: 54 Å, one layer), which are not shown, are alternately arranged, an $Al_{0.328}Ga_{0.672}As$ upper guide layer 507, a p-$Al_{0.476}Ga_{0.524}As$ first upper clad layer 508 and a p-GaAs etching stop layer 509 are successively laminated on an n-GaAs substrate 501. Further, a mesa-stripe-shaped p-$Al_{0.476}Ga_{0.524}As$ second upper clad layer 510 is provided on the etching stop layer 509, and a visor-shaped p-GaAs cap layer 511 is formed on the second clad layer 510. Moreover, an n-$Al_{0.685}Ga_{0.315}As$ first current block layer 512 and an n-GaAs second current block layer 513 are laminated on the etching stop layer 509 located on both sides of the second upper clad layer 510, making the region other than the mesa stripe serve as a current constricting portion. Moreover, a p-GaAs flattening layer 514 is provided on the second current block layer 513, and a p-GaAs contact layer 515 is laminated on the entire surface.

Figure 5:
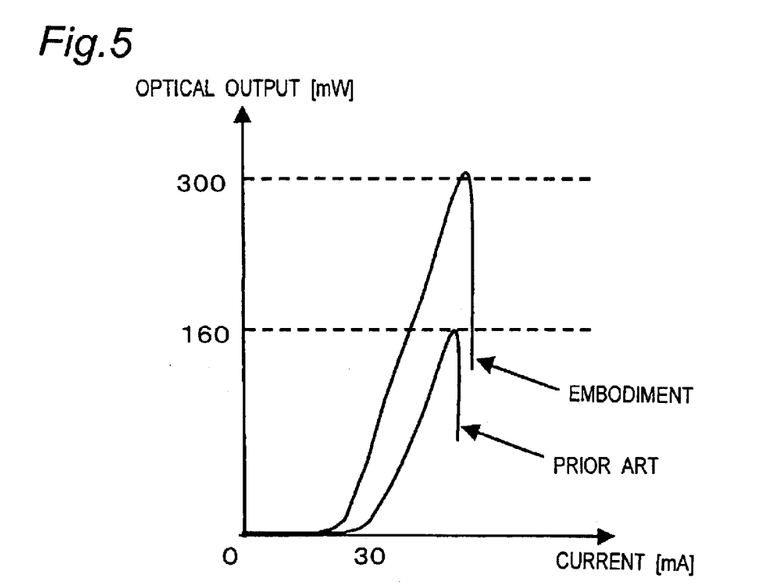
FIG. 5 is a graph showing the optical output-current characteristics of the semiconductor laser devices of the prior art and the first embodiment of the present invention.

FIG. 5 shows a graph of the optical output-current characteristic of this semiconductor laser device. As is apparent from FIG. 5, this semiconductor laser device has a threshold current of about 35 mA and a COD (Catastrophic Optical Damage) level, i.e., an end surface destruction level of about 160 mW.

However, in the aforementioned conventional semiconductor laser device, the COD level has been able to be improved up to only 160 mW although the device has a high power. In the aforementioned conventional AlGaAs-based semiconductor laser device, end surface destruction due to COD is easily caused by the influence of active Al in a high-output driving time. Therefore, it is a basic design guideline for the obtainment of a high-output semiconductor laser device to weaken optical confinement by reducing a value of $\Gamma/d$ standardized by dividing an optical confinement coefficient (assumed to be $\Gamma$) by a well layer thickness (assumed to be d) or reducing the well layer thickness in order to reduce the optical power density at the end surface.

However, a large gain cannot be obtained if the optical confinement is weakened to make the COD level equal to or larger than 160 mW, and therefore, a threshold current increases to disadvantageously increase the drive current. If the well layer thickness is reduced, then the overflow of carriers easily occurs to disadvantageously degrade the temperature characteristic. Accordingly, there has been a problem that only a semiconductor laser device of a large drive current has consequently been able to be provided if it has been attempted to operate the AlGaAs-based semiconductor laser device with an output of not smaller than 160 mW. Therefore, the aforementioned conventional semiconductor laser device has practically been able to stably operate with a peak optical output of about 120 mW.

SUMMARY OF THE INVENTION

Accordingly, the object of the present invention is to provide a high-output semiconductor laser device that employs a GaAs substrate or, in particular, a 780-nm band high-output semiconductor laser device for CD-R/RW, which has high reliability and long operating life in a high-output drive state and has a small drive current and an optical disk reproducing and recording apparatus that employs the semiconductor laser device.

In order to achieve the aforementioned object, the present invention provides a semiconductor laser device, which is constructed by laminating at least a first conductive type lower clad layer, a quantum well active layer comprised of well layers and barrier layers and a second conductive type upper clad layer on a GaAs substrate and has an oscillation wavelength that is greater than 760 nm and smaller than 800 nm, wherein the well layers and the barrier layers are made of InGaAsP, InGaP or GaAsP, and assuming that the well layer has a layer thickness d and an optical confinement coefficient in each one layer of the well layers is $\Gamma$, then $\Gamma/d$ is not smaller than $2.2 \times 10^{-4}$ $Å^{-1}$.

According to the above-mentioned construction, the optical confinement becomes great to allow a large gain to be obtained, because $\Gamma/d$ is not smaller than $2.2 \times 10^{-4}$ $Å^{-1}$. Therefore, a high-output semiconductor laser device with a high COD level can be provided with satisfactory threshold characteristic and temperature characteristic maintained.

Moreover, there can be provided a high-output semiconductor laser device, which has high reliability and long operating life and in which oxidation hardly occurs, because the quantum well active layer is constructed of InGaAsP, InGaP or GaAsP and Al is not contained therein.

In the present specification, the first conductive type means the n-type or the p-type. When the first conductive type is the n-type, the second conductive type is the p-type. When the first conductive type is the p-type, the second conductive type is the n-type.

In one embodiment, the layer thickness of the well layer is not smaller than 80 Å and not greater than 200 Å.

According to the above-mentioned embodiment, the well layer has the great layer thickness of not smaller than 80 Å and not greater than 200 Å. Therefore, a high-output semiconductor laser device with a high COD level can be provided with satisfactory threshold characteristic and temperature characteristic maintained by reducing the overflow of carriers.

Moreover, in one embodiment, the well layer has a compressive strain.

According to the above-mentioned embodiment, the well layer has a compressive strain, and the quantum well active layer becomes a compressive strain quantum well active layer. Therefore, a semiconductor laser device, which has high reliability, long operating life and high output in the 780-nm band can be provided.

Moreover, in one embodiment, an amount of the compressive strain owned by the well layer is within 3.5%.

According to the above-mentioned embodiment, the amount of compressive strain is within 3.5%. Therefore, a high-output semiconductor laser device with high reliability and long operating life can be provided.

Moreover, in one embodiment, the barrier layer has a tensile strain.

According to the above-mentioned embodiment, the barrier layer is a tensile strain barrier layer, and the tensile strain of the barrier layer compensates for the amount of compressive strain of the well layer that has the compressive strain. Therefore, a strained quantum well active layer having a more stable crystal can be produced, and a semiconductor laser device with high reliability can be provided.

Moreover, in one embodiment, an amount of the tensile strain owned by the barrier layer is within 3.5%.

According to the above-mentioned embodiment, the amount of tensile strain is within 3.5%. With this arrangement, a high-output semiconductor laser device with high reliability and long operating life can be provided more suitably.

Moreover, in one embodiment, an upper guide layer is provided between the upper clad layer and the quantum well active layer or a lower guide layer is provided between the lower clad layer and the quantum well active layer or both of the upper guide layer and the lower guide layer are provided, the guide layers each being made of AlGaAs, and a portion that belongs to the quantum well active layer and is put in contact with the guide layer is a barrier layer.

According to the above-mentioned embodiment, the guide layer is made of AlGaAs, and the portion that belongs to the quantum well active layer and is put in contact with the guide layer is the barrier layer. The guide layer made of AlGaAs is not adjacent to the well layer where radiative recombination occurs. Therefore, the overflow of carriers can sufficiently be restrained by the energy (Ec) of the conduction band and the energy (Ev) of the valence band of the guide layer made of AlGaAs, thus reliability being secured. Therefore, a high-output semiconductor laser device with high reliability and long operating life is obtained.

Moreover, in one embodiment, an Al crystal mixture ratio of AlGaAs that constitutes each of the guide layers is greater than 0.2.

According to the above-mentioned embodiment, the Al crystal mixture ratio of AlGaAs that constitutes the guide layer is greater than 0.2. Therefore, a high-output semiconductor laser device with high reliability and long operating life can be provided more suitably.

In one embodiment, the lower clad layer is comprised of a plurality of layers made of AlGaAs of varied Al crystal mixture ratios.

According to the above-mentioned embodiment, the lower clad layer is constructed of a plurality of layers made of a plurality of sorts of AlGaAs of varied Al crystal mixture ratios, thus restraining the absorption of light by the substrate in a high-output stage by effectively shielding the laser light leaking toward the substrate. Accordingly, there can be provided a semiconductor laser device, which has higher reliability, longer operating life and a higher output.

The present invention also provides a semiconductor laser device, which is constructed by laminating at least a first conductive type lower clad layer, a quantum well active layer comprised of well layers and barrier layers and a second conductive type upper clad layer on a GaAs substrate and has an oscillation wavelength that is greater than 760 nm and smaller than 800 nm, wherein the well layers and the barrier layers are made of InGaAsP, InGaP or GaAsP, and the well layer has a layer thickness of not smaller than 80 Å and not greater than 200 Å.

According to the above-mentioned construction, there can be provided a high-output semiconductor laser device, which has high reliability and long operating life, because the quantum well active layer is constructed of InGaAsP, InGaP or GaAsP and oxidation hardly occurs since Al is not contained.

Furthermore, the well layer has the great layer thickness of not smaller than 80 Å and not greater than 200 Å. Therefore, a high-output semiconductor laser device with a high COD level can be provided with satisfactory threshold characteristic and temperature characteristic maintained by reducing the overflow of carriers.

Moreover, in one embodiment, the layer thickness of the well layer is not smaller than 150 Å and not greater than 200 Å.

According to the above-mentioned embodiment, the well layer has the greater layer thickness of not smaller than 150 Å and not greater than 200 Å. Therefore, a semiconductor laser device, which has a high COD level, high reliability, long operating life and a high output can be provided more suitably.

The optical disk reproducing and recording apparatus of the present invention includes the aforementioned semiconductor laser device.

In the optical disk reproducing and recording apparatus of the above-mentioned construction, the semiconductor laser device operates with a higher optical output than the conventional semiconductor laser device, and therefore, data read and write can be achieved even if the rotating speed of the optical disk is made higher than in the conventional case. Therefore, the optical disk reproducing and recording apparatus of the present invention can be operated more comfortably since the access time to the optical disk, which has been a problem particularly during write, is shortened more significantly than in the optical disk reproducing and recording apparatus that employs the conventional semiconductor laser device.

In the optical disk reproducing and recording apparatus of one embodiment, a peak optical output during recording is not smaller than 120 mW at a laser emission end surface of the semiconductor laser device.

According to the above-mentioned embodiment, the peak optical output during recording is not smaller than 120 mW or more at the laser emission end surface of the semiconductor laser device. Therefore, data read and write can be achieved even if the rotating speed of the optical disk is made much faster than in the conventional case.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

First Embodiment

Figure 1:
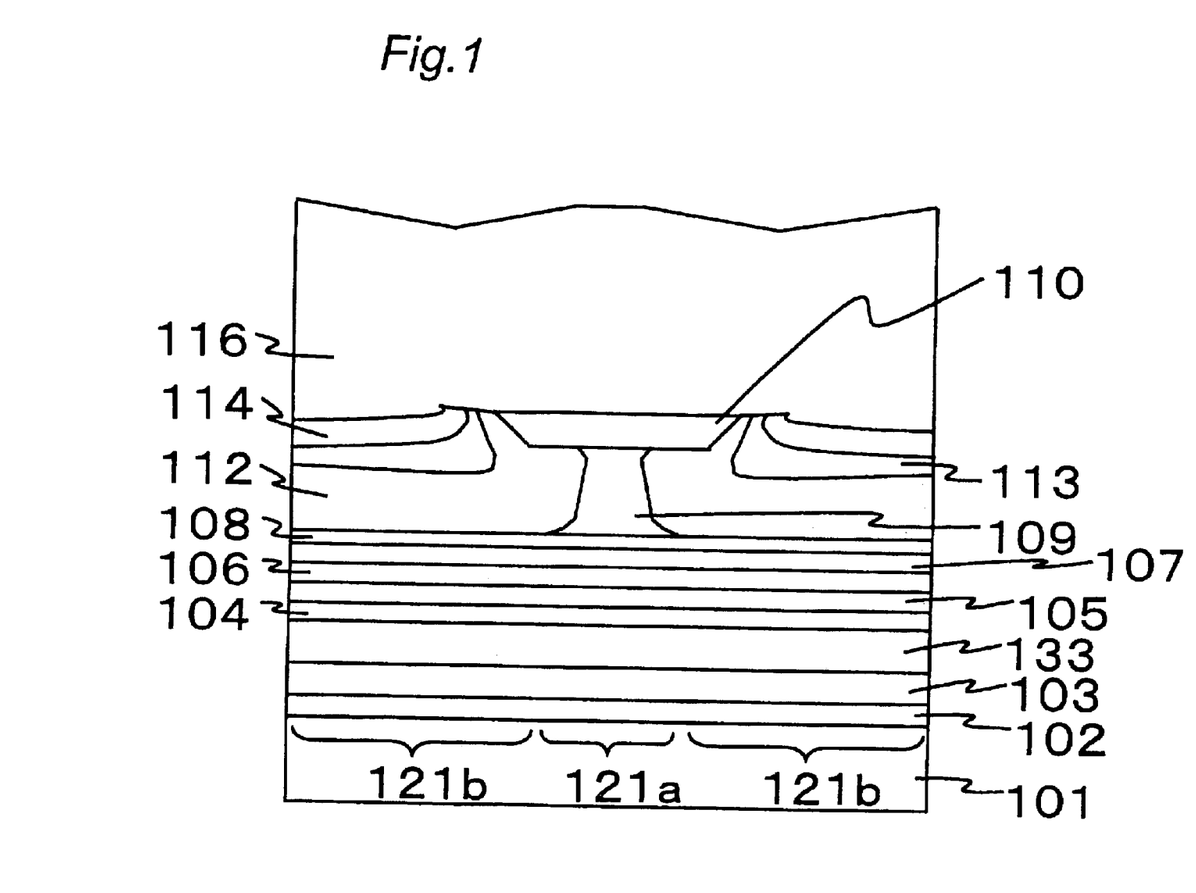
FIG. 1 is a sectional view in which a semiconductor laser device according to a first embodiment of the present invention is cut in a plane perpendicular to a stripe direction.

FIG. 1 shows the structure of the semiconductor laser device of the first embodiment of the present invention. In this semiconductor laser device, an n-GaAs buffer layer 102, an n-$Al_{0.445}Ga_{0.555}As$ first lower clad layer 103, an n-$Al_{0.561}Ga_{0.439}As$ second lower clad layer 133, an $Al_{0.35}Ga_{0.65}As$ lower guide layer 104, a multiple quantum well active layer 105 where $In_{0.1811}Ga_{0.8189}As_{0.6668}P_{0.3332}$ compressive strain quantum well layers and $In_{0.05}Ga_{0.95}As_{0.6469}P_{0.3531}$ tensile strain barrier layers, which are not shown, are alternately arranged, an $Al_{0.35}Ga_{0.65}As$ upper guide layer 106, a p-$Al_{0.4885}Ga_{0.5115}As$ first upper clad layer 107 and a p-GaAs etching stop layer 108 are successively laminated on an n-GaAs substrate 101. A mesa-stripe-shaped p-$Al_{0.4885}Ga_{0.5115}As$ second upper clad layer 109 and a visor-shaped GaAs cap layer 110 are provided on this etching stop layer 108. Both sides of the second upper clad layer 109 and the GaAs cap layer 110 are filled by a light- and current-constricting region constructed of an n-$Al_{0.7}Ga_{0.3}As$ first current block layer 112, an n-GaAs second current block layer 113 and a p-GaAs flattening layer 114, and further a p-GaAs cap layer 116 is provided on the entire surface. This semiconductor laser device has a mesa stripe portion 121*a* and mesa stripe portion side portions 121*b* and 121*b* located on both sides of the mesa stripe portion 121*a*.

The fabricating method of the semiconductor laser structure will be described next with reference to FIGS. 2 through 4.

Figure 2:
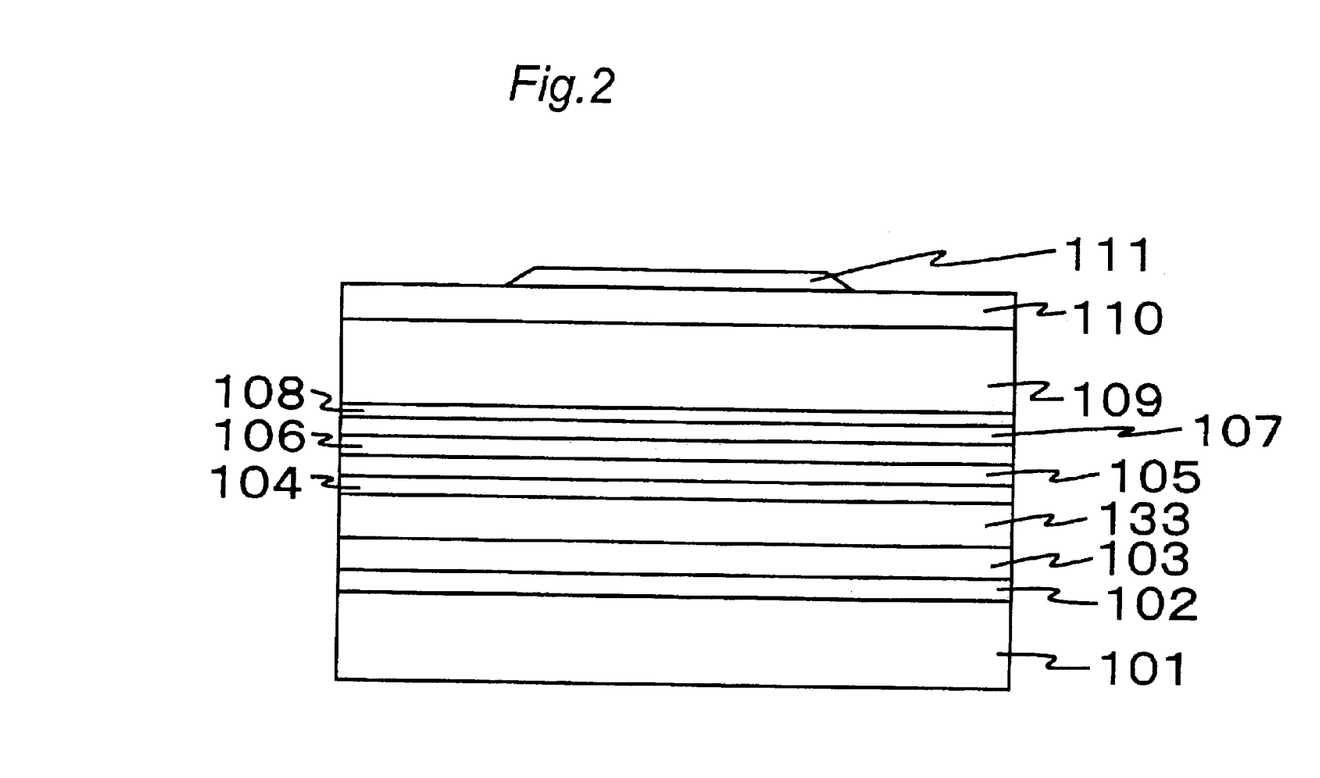
FIGS. 2, 3 and 4 are sectional views showing the fabricating method of the semiconductor laser device of the first embodiment of the present invention.

First of all, as shown in FIG. 2, the n-GaAs buffer layer 102 (layer thickness: 0.5 μm), the n-$Al_{0.445}Ga_{0.555}As$ first lower clad layer 103 (layer thickness: 3 μm), the n-$Al_{0.561}Ga_{0.439}As$ second lower clad layer 133 (layer thickness: 0.2 μm), the $Al_{0.35}Ga_{0.65}As$ lower guide layer 104 (layer thickness: 24 nm), the multiple quantum well active layer 105 where the $In_{0.1811}Ga_{0.8189}As_{0.6668}P_{0.3332}$ compressive strain quantum well layers (strain: 0.12%, layer thickness: 160 Å, two layers) and the $In_{0.05}Ga_{0.95}As_{0.6469}P_{0.3531}$ tensile strain barrier layers (strain: –0.9%, three layers of 100 Å, 50 Å and 100 Å in layer thickness from the substrate side) are alternately arranged, the $Al_{0.35}Ga_{0.65}As$ upper guide layer 106 (layer thickness: 24 nm), the p-$Al_{0.4885}Ga_{0.5115}As$ first upper clad layer 107 (layer thickness: 0.1916 μm), the p-GaAs etching stop layer 108 (layer thickness: 30 Å), the p-$Al_{0.4885}Ga_{0.5115}As$ second upper clad layer 109 (layer thickness: 1.28 μm) and the GaAs cap layer 110 (layer thickness: 0.75 μm) are successively crystallinically grown on the n-GaAs substrate 101 that has a (100) plane by the metal-organic chemical vapor deposition method. Further, a resist mask 111 (mask width: 5.5 μm) is produced by a photographic process in a portion where a mesa stripe portion is formed so that the stripe direction has a [011] direction.

Figure 3:
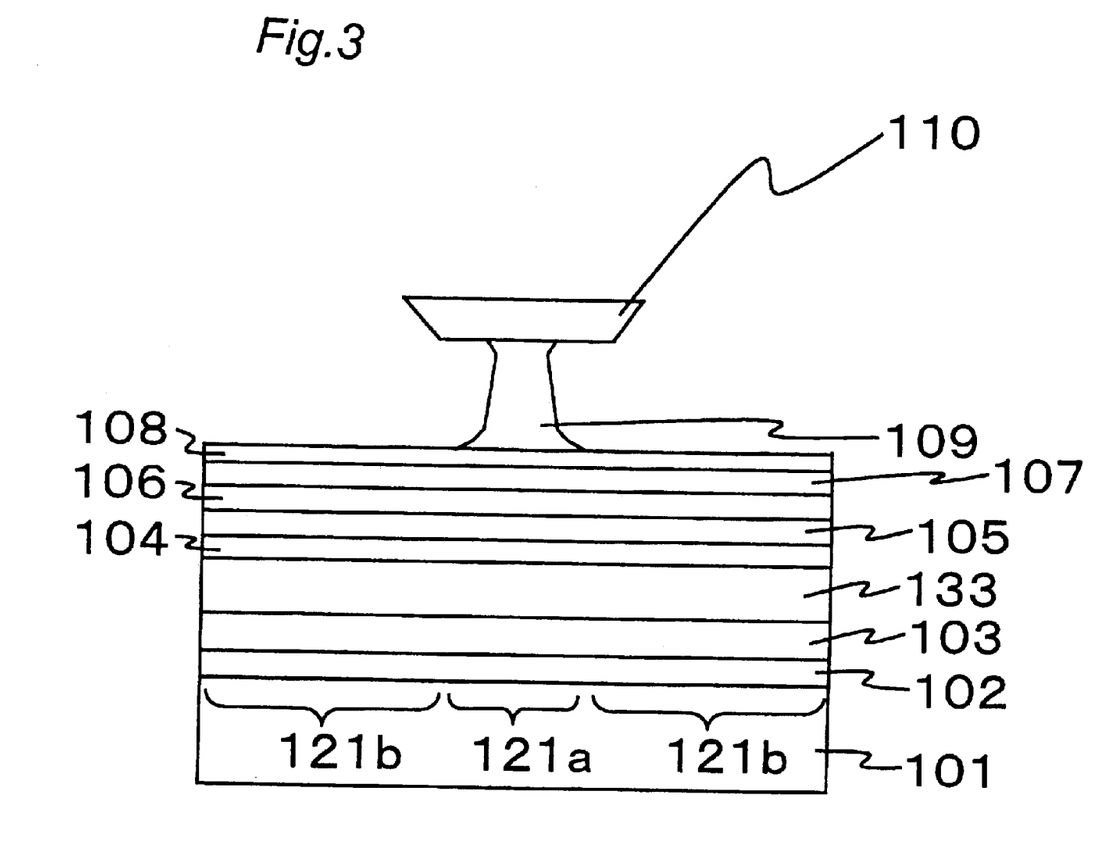

Next, as shown in FIG. 3, the portion other than the resist mask portion 111 is etched to form the mesa stripe portion 121*a*. The etching is performed in two stages by using an aqueous solution obtained by mixing sulfuric acid with a hydrogen peroxide aqueous solution and hydrofluoric acid down to a portion immediately above the etching stop layer 108. Taking advantage of the fact that GaAs has a very slow etching rate with hydrofluoric acid, it is enabled to flatten the etching surface and control the width of the mesa stripe. The etching depth is 1.95 μm, and the width of the lowermost portion of the mesa stripe is about 2.5 μm. After the etching, the resist mask 111 is removed.

Figure 4:
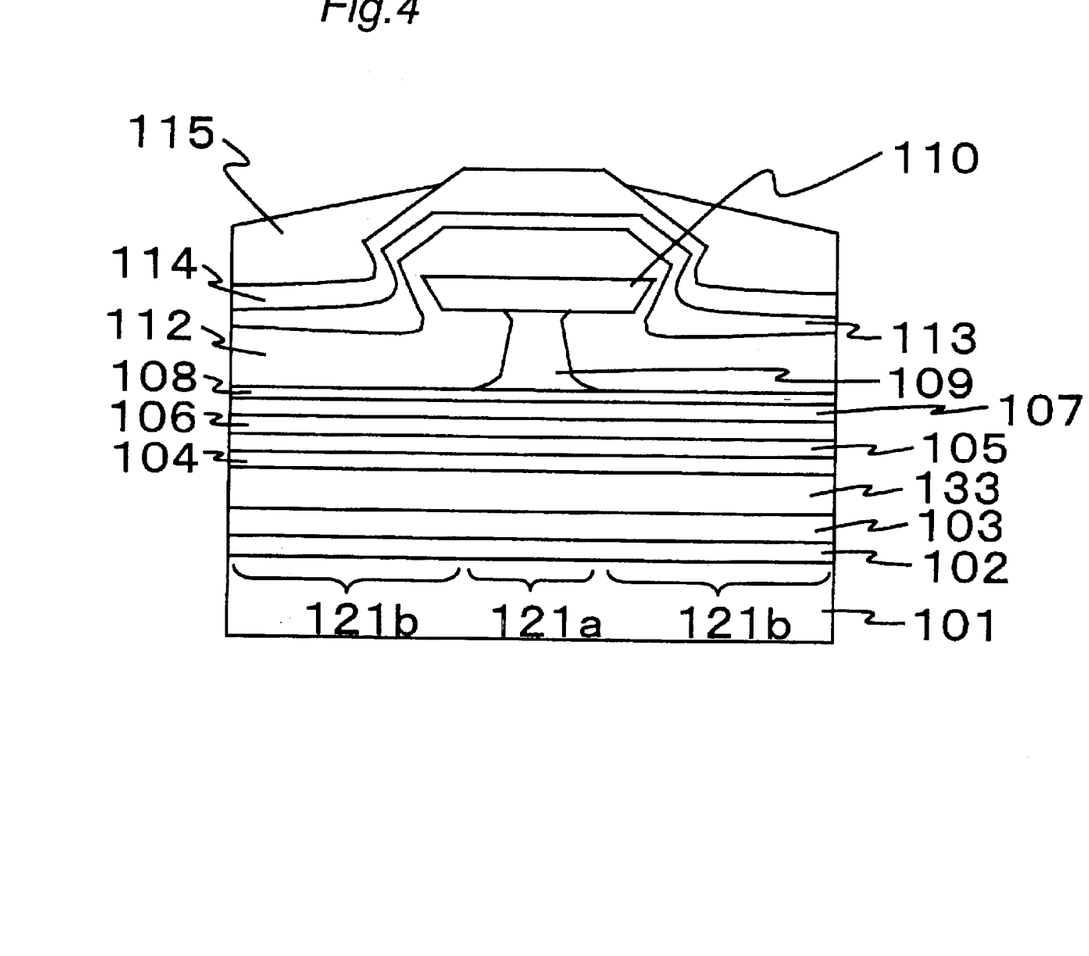

Subsequently, as shown in FIG. 4, the n-$Al_{0.7}Ga_{0.3}As$ first current block layer 112 (layer thickness: 1.0 μm), the n-GaAs second current block layer 113 (layer thickness: 0.3 μm) and the p-GaAs flattening layer 114 (layer thickness: 0.65 μm) are successively subjected to metal-organic crystallinic growth, forming a light- and current-constricting region. Subsequently, the resist mask 115 is formed by a photographic process only on the mesa stripe portion side portions 121*b* and 121*b*.

Subsequently, the flattening layer 114, the second current block layer 113 and the first current block layer 112 on the mesa stripe portion 121*a* are removed by etching. This etching is performed in two stages by using an aqueous solution obtained by mixing ammonia with a hydrogen peroxide aqueous solution and an aqueous solution obtained by mixing sulfuric acid with a hydrogen peroxide aqueous solution. Subsequently, the resist mask 115 is removed, and the p-GaAs cap layer 116 (layer thickness: 2.0 μm) is laminated. As described above, the semiconductor laser device of the structure shown in FIG. 1 can be fabricated.

It was confirmed that the semiconductor laser device of the present first embodiment had an oscillation wavelength of 780 nm and, as shown in FIG. 5, the COD (Catastrophic Optical Damage) level, i.e., the end surface destruction level was 300 mW. In the conventional semiconductor laser device fabricated with an AlGaAs-based material, it is considered that Al oxide is easily generated on the laser end surface due to the existence of active Al, and COD easily occurs in a high-output driving time, acting as an obstruction to a high output, high reliability and long operating life. Therefore, it has conventionally been a basic design guideline to weaken the optical confinement by reducing a value of $\Gamma/d$ standardized by dividing an optical confinement coefficient (assumed to be $\Gamma$) by a well layer thickness (assumed to be d) or reducing the well layer thickness in order to reduce the optical power density at the end surface.

Figure 6:
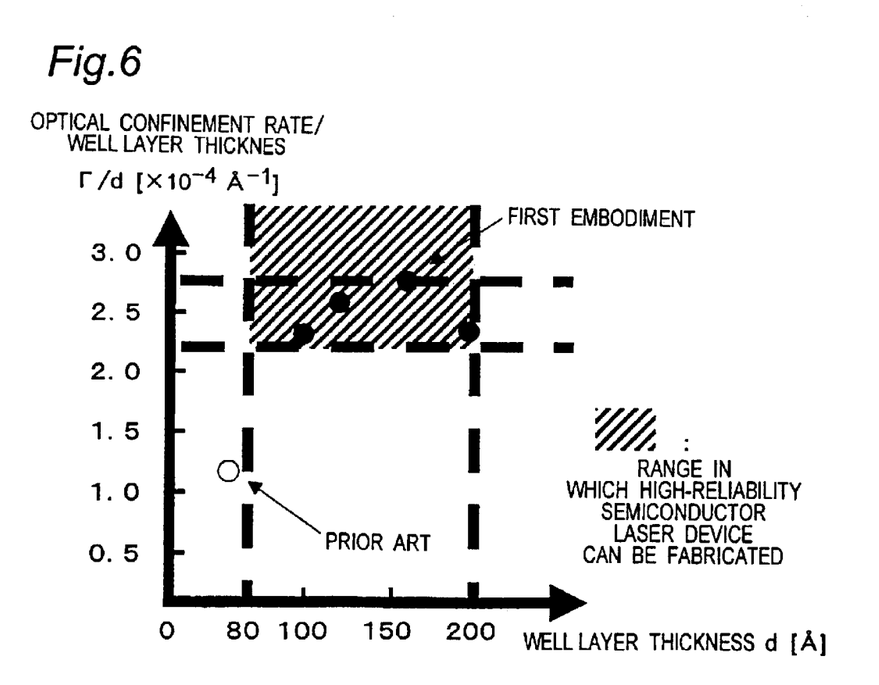
FIG. 6 is a graph showing the relation of the optical confinement rate/well layer thickness ($\Gamma/d$) with respect to the well layer thickness (d) of the semiconductor laser devices of the prior art and the present invention.

The present inventor and others conducted energetic researches on a 780-nm band high-output semiconductor laser device that utilized a quantum well active layer made of InGaAsP and discovered a high-output semiconductor laser device that had satisfactory characteristics by strengthening the optical confinement or increasing the well layer thickness conversely to the conventional case and utterly dissimilarly to the conventional AlGaAs-based semiconductor laser. In concrete, for example, as in the present first embodiment, in a semiconductor laser device in which at least the first and second lower clad layers 103 and 133, the quantum well active layer 105 constructed of the well layers and the barrier layers, the first and second upper clad layers 107 and 109 were laminated on the GaAs substrate 101 and the oscillation wavelength was greater than 760 nm and smaller than 800 nm, by making the well layer of InGaAsP, making the well layer have a great layer thickness of 160 Å and making $\Gamma/d$ have a great value of $2.75 \times 10^{-1}$ Å$^{-1}$, a high-output semiconductor laser device with a high COD level was able to be provided with satisfactory threshold characteristic and temperature characteristic maintained. The semiconductor laser device of this first embodiment was subjected to a reliability test at 70° C. and 260 mW, and it was confirmed that the device stably operated for 10,000 hours or more. FIG. 6 shows a graph of the relation of $\Gamma/d$ to d, which is calculated by properly adjusting the guide layer thickness of a semiconductor laser device to be used for an optical disk reproducing and recording apparatus with the well layer thickness d served as a variable so that a vertical radiation angle becomes 17°. It was confirmed that the semiconductor laser devices fabricated within the hatched region were able to obtain satisfactory reliability. If d is smaller than 80 Å, then $\Gamma$ also becomes small, and there are observed an increase in the threshold current and an increase in the overflow of carriers, resulting in degraded characteristics. Moreover, if d is greater than 200 Å, then the guide layer thickness for the vertical radiation angle adjustment is presumed to be about 70 Å. The optical confinement is degraded, and $\Gamma/d$ also becomes small. Therefore, due to a reduction in gain, degraded characteristics such as an increase in the threshold current result.

Figure 7:
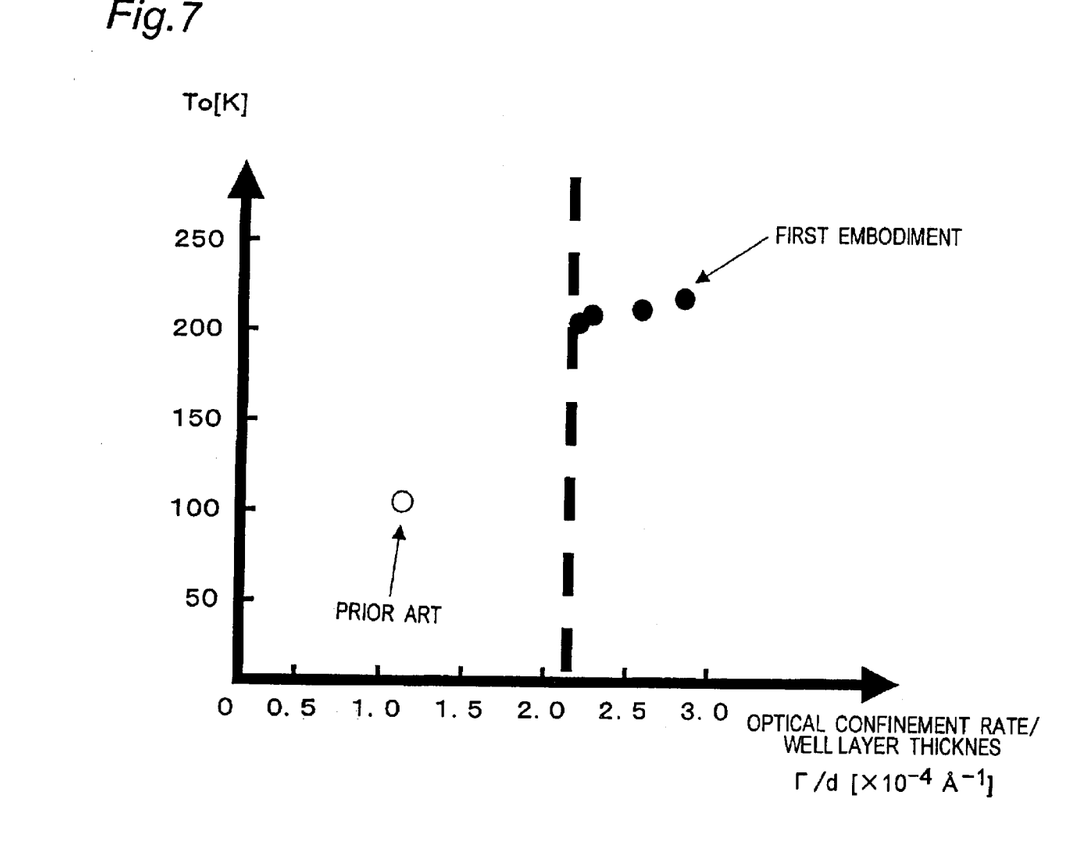
FIG. 7 is a graph showing the relation of the temperature characteristic (To) with respect to $\Gamma/d$ of the semiconductor laser devices of the prior art and the present invention.

In the present first embodiment, $\Gamma/d$ is $2.75 \times 10^{-4}$ Å$^{31\ 1}$. However, as shown in the graph of FIG. 7 showing the relation of the temperature characteristic To (K) of the semiconductor laser device with respect to $\Gamma/d$, it was confirmed that a satisfactory temperature characteristic was exhibited by strengthening the optical confinement with $\Gamma/d$ set to the large value of $2.2 \times 10^{-4}$ Å$^{-1}$ or more.

Figure 8:
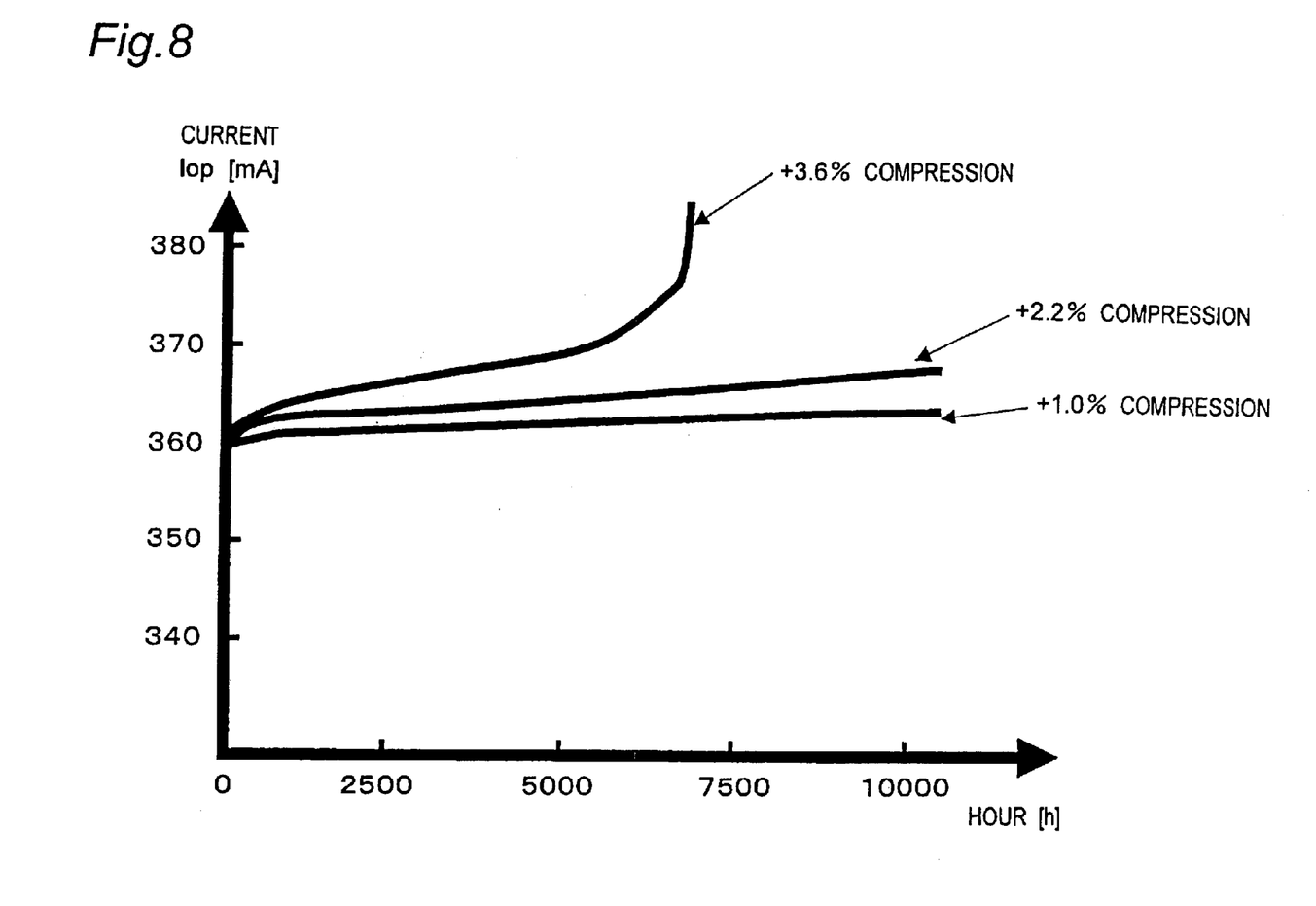
FIG. 8 is a graph showing the reliability (under the conditions of 70° C. and 260 mW) of the semiconductor laser device in relation to the amount of compressive strain of the well layer and the current Iop of the semiconductor laser device of the present invention.

Moreover, the present first embodiment employs the compressive strain quantum well active layer 105 constructed of InGaAsP on the GaAs substrate 101. With this arrangement, a high-output semiconductor laser device having high reliability and long operating life particularly in the 780-nm band is provided. Further, by increasing the optical confinement with the increased d and the increased $\Gamma/d$, a semiconductor laser device of a higher output was able to be obtained. Moreover, the above-mentioned effects were able to be obtained more suitably when the amount of compressive strain was within 3.5%. Assuming that the lattice constant of the GaAs substrate 101 is aGaAs and the lattice constant of the well layer is a1, then the amount of strain mentioned herein is expressed as (a1−aGaAs)/aGaAs. The strain is called the compressive strain if this value is positive and called the tensile strain if this value is negative. FIG. 8 is a graph showing the reliability (70° C., 260 mW) of the semiconductor laser device depending on a difference in the amount of compressive strain of the well layer. It can be understood that the reliability is degraded when the amount of compressive strain exceeds 3.5%. This is presumably ascribed to the degraded crystallinity because the amount of compressive strain is too large. In FIG. 8, Iop is a current value when the semiconductor laser device yields an output of 260 mW.

In the present first embodiment, the tensile strain barrier layer made of InGaAsP is employed to compensate for the amount of strain of the well layer that has a compressive strain. Therefore, the multiple strain quantum well active layer 105 having a more stabilized crystal was able to be fabricated, and a semiconductor laser device of high reliability was able to be provided. Moreover, the aforementioned effects were able to be obtained more suitably when the amount of tensile strain is within 3.5%.

Figure 9:
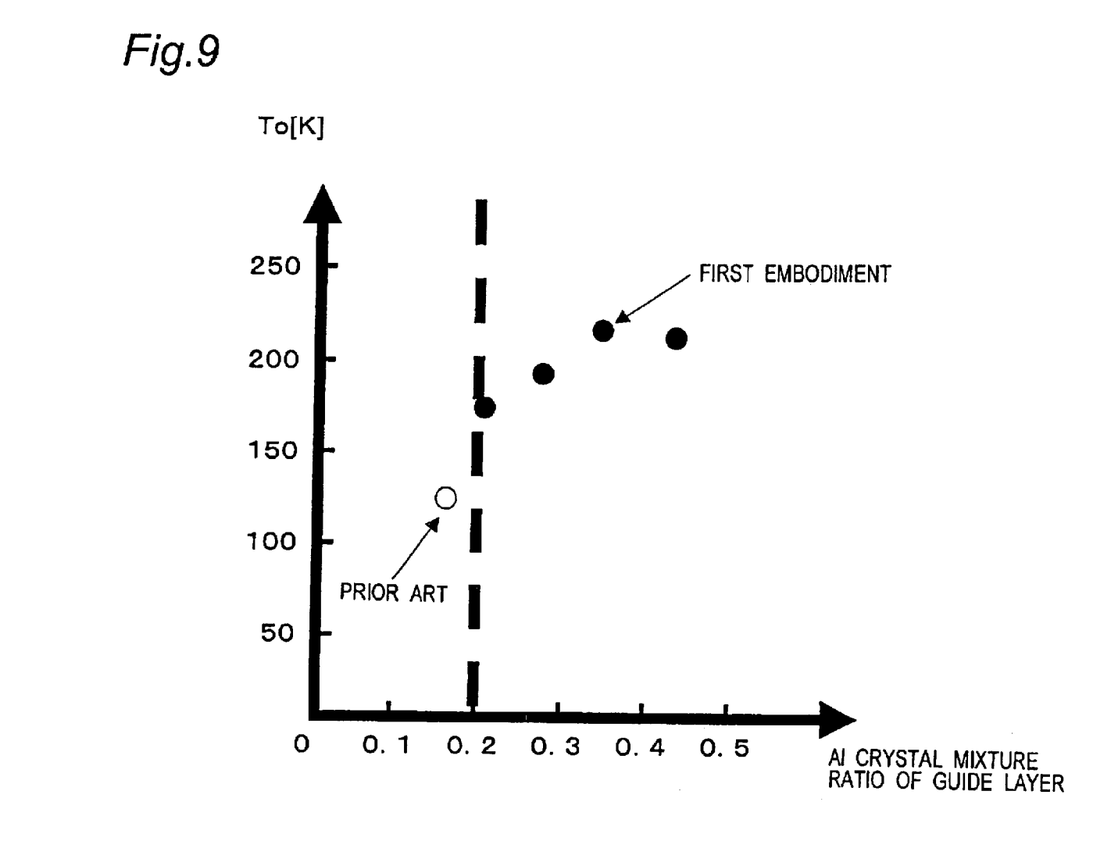
FIG. 9 is a graph showing the relation of the temperature characteristic (To) with respect to the Al crystal mixture ratio of the guide layer of the semiconductor laser device of the present invention.

Moreover, in the present first embodiment, the lower and under guide layers 104 and 106 are made of AlGaAs, and the portions, which belongs to the quantum well active layer 105 and are put in contact with the lower and under guide layers 104 and 106 serve as a barrier layer made of InGaAsP free of Al. With this arrangement, reliability was secured with no AlGaAs located adjacent to the well layer where the radiative recombination occurred, the effect of sufficiently restraining the overflow of carriers was able to be obtained by the energy (Ec) of the conduction band and the energy (Ev) of the valence band of AlGaAs. Normally, when fabricating an Al-free semiconductor laser device for the obtainment of high reliability, the layers inclusive of the guide layer and the clad layer are all free of Al using InGaP or the like. However, in the present embodiment, AlGaAs, which has an Al crystal mixture ratio greater than 0.2 and is able to obtain an energy difference ($\Delta$Ec) of the conduction band and an energy difference ($\Delta$Ev) of the valence band with good balance with respect to the well layer made of InGaAsP for the 780-nm oscillation wavelength band, is provided as a guide layer while being located as close as possible to the well layer to the extent that no influence is exerted on reliability. FIG. 9 shows a graph showing the relation of the temperature characteristic (To) with respect to the Al crystal mixture ratio of the guide layer. It was confirmed that the temperature characteristic was improved in the case of the guide layer of AlGaAs whose Al crystal mixture ratio is greater than 0.2. An Al-free InGaAsP-based thin barrier layer is provided between the well layer and the guide layer. With this arrangement, the aforementioned effect is obtained. By making only the well layer and the barrier layers located on both sides free of Al and making the layers outside the guide layer contain Al, sufficiently high reliability can be obtained. With regard to Al, the greatest influence is exerted when the well layer that serves as a light-emitting section and the adjacent regions are made free of Al, and high reliability can be obtained with the layer that contains Al slightly separated apart outside. A distance of separation is required to be not smaller than about 70 Å.

Moreover, in the present first embodiment, there is provided the two-tier clad layer constructed by successively laminating the first lower clad layer 103 made of $Al_{0.445}Ga_{0.555}As$ and the second lower clad layer 133 made of $Al_{0.561}Ga_{0.439}As$, and the laser light, which leaks in the direction of the substrate, is effectively screened. This arrangement was able to obtain the effects of further restraining the absorption of light by the substrate in the high-output stage and increasing the output and the reliability of the semiconductor laser device.

Although the semiconductor laser device of the present first embodiment has the buried ridge structure, the present invention is not limited to this. Similar effects can be obtained with any structure such as another ridge structure, an internal stripe structure and a buried hetero structure. Although the present first embodiment employs the n-type substrate, a similar effect can be obtained even if a p-type substrate is employed and the n-type and the p-type of the aforementioned embodiment are interchanged with each other. Although the wavelength is set at 780 nm, the present invention is not limited to this. A similar effect can be obtained in the so-called 780-nm band that is greater than 760 nm and smaller than 800 nm.

Second Embodiment

Figure 10:
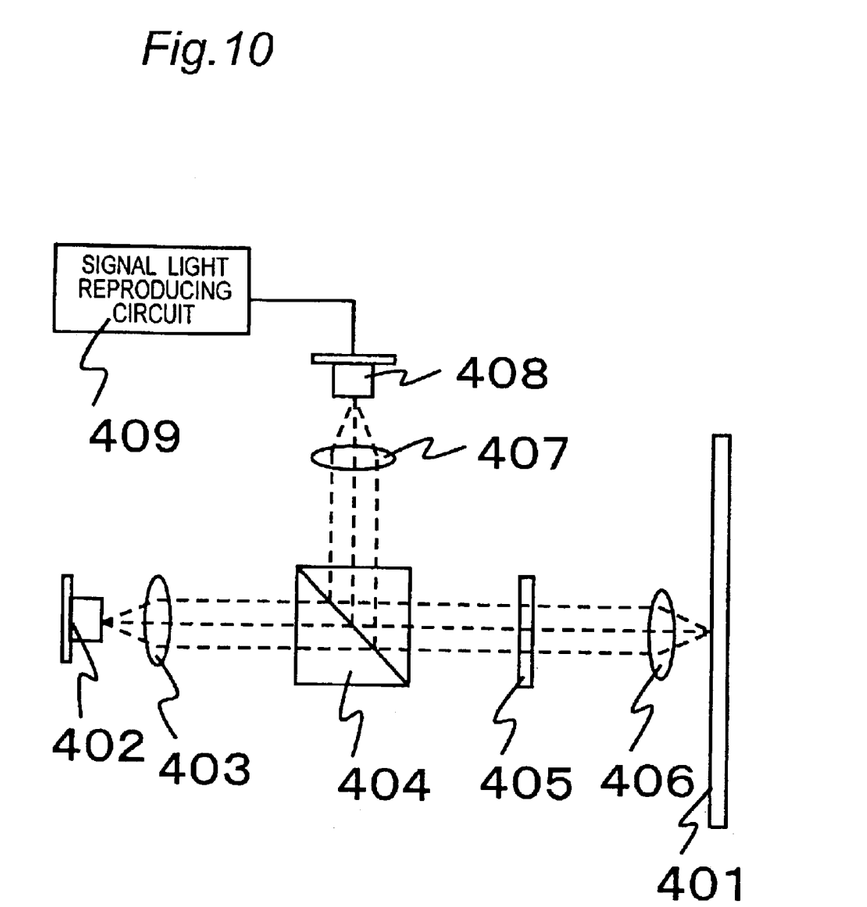
FIG. 10 is a schematic view of an optical disk recording and reproducing apparatus according to a second embodiment of the present invention.

FIG. 10 shows the structure of the optical disk recording and reproducing apparatus of the second embodiment of the present invention. This optical disk recording and reproducing apparatus is to write data and reproduce the written data on an optical disk 401. As a light-emitting device, the same semiconductor laser device 402 as the semiconductor laser device of the first embodiment described hereinbefore is provided. In this semiconductor laser device 402, a peak optical output during recording is 120 mW or more at its laser emission end surface.

This optical disk recording and reproducing apparatus will be described more in detail. During write, laser light which is emitted from the semiconductor laser device 402 and on which a data signal is carried is transformed into parallel light by a collimator lens 403 and transmitted through a beam splitter 404. The laser light, which has been transmitted through this beam splitter 404, has its polarization state adjusted by a λ/4 polarizing plate 405, thereafter concentrated by an object lens 406 and then applied to the optical disk 401, recording data on this optical disk 401.

During read, laser light on which no data signal is carried is applied to the optical disk 401 through the same path as in the writing stage. This laser light is reflected on the surface of the optical disk 401 on which the data are recorded and becomes reproduction light on which the data signal is carried. This reproduction light travels through the object lens 406 for laser light application and the λ/4 polarizing plate 405 and changes its course at an angle of 90 degrees by being reflected on the beam splitter 404, thereafter concentrated by an object lens 407 for the reproduction light and then enters a light-receiving element 408 for signal detection. Inside this light-receiving element 408 for signal detection, the data signal carried on the laser light is converted into an electrical signal according to the magnitude of the intensity of the incident laser light, and the original data are reproduced in a signal light reproducing circuit 409.

The optical disk recording and reproducing apparatus of the second embodiment employs the semiconductor laser device 402 that operates with an optical output higher than that of the conventional semiconductor laser device, and therefore, data read and write can be achieved even if the rotating speed of the disk is made faster than in the conventional case. In particular, the peak optical output during write of the semiconductor laser device 402 is not smaller than 120 mW at the laser emission end surface. Therefore, the access time to the optical disk, which has been a problem during write, becomes significantly shorter than that of the optical disk recording and reproducing apparatus that employs the conventional semiconductor laser device, and this optical disk recording and reproducing apparatus can be operated more comfortably.

Herein has been described the example in which the aforementioned semiconductor laser device is applied to the optical disk recording and reproducing apparatus. However, it is needless to say that the semiconductor laser device of the present invention can also be applied to an optical disk recording apparatus and an optical disk reproducing apparatus, which use the 780-nm wavelength band.

It is to be noted that the semiconductor laser device and the optical disk reproducing and recording apparatus of the present invention are not limited to the aforementioned illustrated example, and it is, of course, possible to modify the device and the apparatus in various ways within the scope unless they depart from the essence of the present invention.

As is apparent from the above, according to the present invention, the well layer and the barrier layer of the quantum well active layer are made of InGaAsP, InGaP or GaAsP and do not contain Al, and therefore, oxidation hardly occurs. Moreover, assuming that the layer thickness of the well layer is d and the optical confinement coefficient of one layer of the well layer is $\Gamma$, then $\Gamma/d$ is not smaller than $2.2 \times 10^{-4} \text{ Å}^{-1}$. Therefore, the optical confinement becomes great to allow a large gain to be obtained, and this enables the provision of a high-output semiconductor laser device, which has a high COD level, high reliability and long operating life with satisfactory threshold characteristic and temperature characteristic maintained.

Moreover, according to the present invention, the well layer and the barrier layer of the quantum well active layer are made of InGaAsP, InGaP or GaAsP and do not contain Al, and therefore, oxidation hardly occurs. Moreover, the well layer has the great layer thickness of not smaller than 80 Å and not greater than 200 Å. Accordingly, there can be provided a high-output semiconductor laser device, which has a high COD level, high reliability and long operating life with satisfactory threshold characteristic and temperature characteristic maintained by reducing the overflow of carriers.

Moreover, the optical disk reproducing and recording apparatus of the present invention employs the semiconductor laser device, which has high reliability, long operating life and a high output. Therefore, data read and write can be achieved even if the rotating speed of the optical disk is made faster than in the conventional case. The access time to the optical disk becomes significantly shorter than that of the conventional optical disk reproducing and recording apparatus, and this allows more comfortable operation to be performed.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A semiconductor laser device, comprising:
a first conductive type lower clad layer,
a quantum well active layer comprised of well layers and barrier layers, and a second conductive type upper clad layer supported by a GaAs substrate, wherein the semiconductor laser device has an oscillation wavelength that is greater than 760 nm and smaller than 800 nm, wherein
the well layers and the barrier layers are made of InGaAsP, InGaP or GaAsP, and
the well layer has a layer thickness d, and an optical confinement coefficient in each one layer of the well layers is $\Gamma$, so that $\Gamma/d$ is not smaller than $2.2 \times 10^{-4} \text{ Å}^{-1}$.

2. The semiconductor laser device as claimed in claim 1, wherein the layer thickness of the well layer is not smaller than 80 Å and not greater than 200 Å.

3. The semiconductor laser device as claimed in claim 1, wherein the well layer has a compressive strain.

4. The semiconductor laser device as claimed in claim 3, wherein an amount of the compressive strain of the well layer is within 3.5%.

5. The semiconductor laser device as claimed in claim 1, wherein the barrier layer has a tensile strain.

6. The semiconductor laser device as claimed in claim 5, wherein an amount of the tensile strain of the barrier layer is within 3.5%.

7. The semiconductor laser device as claimed in claim 1, wherein an upper guide layer is provided between the upper clad layer and the quantum well active layer or a lower guide layer is provided between the lower clad layer and the quantum well active layer or both of the upper guide layer and the lower guide layer are provided, the guide layers each being made of AlGaAs, and a portion that belongs to the quantum well active layer and is put in contact with the guide layer is a barrier layer.

8. The semiconductor laser device as claimed in claim 7, wherein an Al crystal mixture ratio of AlGaAs that constitutes each of the guide layers is greater than 0.2.

9. The semiconductor laser device as claimed in claim 1, wherein the lower clad layer is comprised of a plurality of layers made of AlGaAs of varied Al crystal mixture ratios.

10. A semiconductor laser device, comprising:
a first conductive type lower clad layer, a quantum well active layer comprised of well layers and barrier layers, and a second conductive type upper clad layer supported by a substrate comprising GaAs, wherein the semiconductor laser device has an oscillation wavelength that is greater than 760 nm and smaller than 800 nm, wherein
the well layers and the barrier layers comprise at least one of InGaAsP, InGaP or GaAsP, and
the well layer has a layer thickness d of not smaller than 80 Å and not greater than 200 Å, and an optical confinement coefficient in each one layer of the well layers is $\Gamma$, so that $\Gamma/d$ is not smaller than $2.2 \times 10^{-4}$ Å$^{-1}$.

11. The semiconductor laser device as claimed in claim 10, wherein the layer thickness of the well layer is not smaller than 150 Å and not greater than 200 Å.

12. An optical disk reproducing and recording apparatus including the semiconductor laser device claimed in claim 1.

13. The optical disk reproducing and recording apparatus as claimed in claim 12, wherein a peak optical output during recording is not smaller than 120 mW at a laser emission end surface of the semiconductor laser device.

14. An optical disk reproducing and recording apparatus including the semiconductor laser device claimed in claim 10.

15. The optical disk reproducing and recording apparatus as claimed in claim 14, wherein a peak optical output during recording is not smaller than 120 mW at a laser emission end surface of the semiconductor laser device.

16. The semiconductor laser device of claim 1, wherein the laser device is an end face emission type laser device so that a laser beam is emitted through an end face of the active layer in a direction perpendicular to a direction in which the recited layers are stacked on the substrate.

17. The semiconductor laser device of claim 1, further comprising:
at least one guide layer comprising AlGaAs located adjacent to and contacting the quantum well active layer, wherein said guide layer comprising AlGaAs does not contact any well layer of the quantum well active layer but is adjacent to and directly contacts one of the barrier layers with tensile strain of the quantum well active layer, and
wherein a distance between the guide layer comprising AlGaAs and one of the well layers closest to said guide layer comprising AlGaAs is from 70–100 Å.

18. The semiconductor laser device of claim 10, further comprising:
at least one guide layer comprising AlGaAs located adjacent to and contacting the quantum well active layer, wherein said guide layer comprising AlGaAs does not contact any well layer of the quantum well active layer but is adjacent to and directly contacts one of the barrier layers with tensile strain of the quantum well active layer, and
wherein a distance between the guide layer comprising AlGaAs an one of the well layers closest to said guide layer comprising AlGaAs is from 70–100 Å.

19. The semiconductor laser device of claim 1, wherein the semiconductor laser has a stripe shaped structure.

20. The semiconductor laser device of claim 19, wherein stripe shaped structure comprises a ridge stripe of the second conductive type upper clad layer.

21. The semiconductor laser device of claim 1, further comprising a cap layer comprised of GaAs provided over the second conductive type upper clad layer.

22. The semiconductor laser device of claim 10, wherein the semiconductor laser has a stripe shaped structure.

23. The semiconductor laser device of claim 22, wherein the stripe shaped structure comprises a ridge stripe of the second conductive type upper clad layer.

24. The semiconductor laser device of claim 10, further comprising a cap layer comprised of GaAs provided over the second conductive type upper clad layer.

25. The semiconductor laser device of claim 10, wherein the laser device is an end face emission type laser device so that a laser beam is emitted through an end face of the active layer in a direction perpendicular to a direction in which the recited layers are stacked on the substrate.

* * * * *